(12) United States Patent
Veerasamy et al.

(10) Patent No.: US 6,919,536 B2
(45) Date of Patent: Jul. 19, 2005

(54) VEHICLE WINDOW WITH ICE REMOVAL STRUCTURE THEREON

(75) Inventors: Vijayen S. Veerasamy, Farmington Hills, MI (US); Scott V. Thomsen, Milford, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 105 days.

(21) Appl. No.: 10/116,115

(22) Filed: Apr. 5, 2002

(65) Prior Publication Data

US 2003/0190476 A1 Oct. 9, 2003

(51) Int. Cl.$^7$ ............................................. B32B 17/06
(52) U.S. Cl. ..................... 219/203; 52/171.2; 296/84.1; 296/190.1; 428/195; 428/209; 428/408; 428/432; 428/472
(58) Field of Search ........................... 296/84.1, 190.1; 52/71.2; 219/203; 428/195, 209, 408, 432, 472, 210, 434, 704

(56) References Cited

U.S. PATENT DOCUMENTS

| | | | |
|---|---|---|---|
| 4,017,661 A | * | 4/1977 | Gillery |
| 4,786,783 A | * | 11/1988 | Woodard |
| 4,828,346 A | * | 5/1989 | Jacobsen et al. |
| 5,007,689 A | * | 4/1991 | Kelly et al. |
| 5,425,983 A | * | 6/1995 | Propst et al. |
| 5,470,661 A | | 11/1995 | Bailey et al. |
| 5,493,102 A | * | 2/1996 | Takase et al. |
| 5,557,462 A | | 9/1996 | Hartig et al. |
| 5,637,353 A | | 6/1997 | Kimock et al. |
| 5,653,904 A | * | 8/1997 | Adlparvar et al. |
| 5,718,976 A | | 2/1998 | Dorfman et al. |
| 5,858,477 A | | 1/1999 | Veerasamy et al. |
| 5,928,793 A | | 7/1999 | Kimura |
| 6,027,075 A | | 2/2000 | Petrenko |
| 6,046,758 A | | 4/2000 | Brown et al. |
| 6,259,549 B1 | | 7/2001 | Leupolz et al. |
| 6,261,693 B1 | | 7/2001 | Veerasamy |
| 6,280,834 B1 | | 8/2001 | Veerasamy et al. |
| 6,284,377 B1 | | 9/2001 | Veerasamy |
| 6,303,225 B1 | | 10/2001 | Veerasamy |
| 6,303,226 B2 | | 10/2001 | Veerasamy |
| 6,312,808 B1 | | 11/2001 | Veerasamy et al. |
| 6,335,086 B1 | | 1/2002 | Veerasamy |
| 6,338,901 B1 | | 1/2002 | Veerasamy |
| 2001/0052731 A1 | | 12/2001 | Petrenko |
| 2002/0017466 A1 | | 2/2002 | Petrenko |

FOREIGN PATENT DOCUMENTS

| | | |
|---|---|---|
| WO | WO 00/24634 | 5/2000 |
| WO | WO 00/33614 | 6/2000 |
| WO | WO 00/52966 | 9/2000 |

OTHER PUBLICATIONS

"Tetrahedral Amorphous Carbon Deposition, Characterisation and Electronic Properties", VEERASAMY, Jul. 1994, pp. 1–294.

* cited by examiner

Primary Examiner—Archene Turner
(74) Attorney, Agent, or Firm—Nixon & Vanderhye P.C.

(57) ABSTRACT

A window includes an ice removal structure thereon for weakening the adhesion strength of ice to the window upon an application of voltage. The ice removal structure is at least partially covered and/or coated with a layer of diamond-like carbon (DLC) in certain embodiments. In certain embodiments, the DLC may be of a type known as ta-C which can be very dense and have a large number of $sp^3$ carbon-carbon bonds. The DLC protects the ice removal structure, and in certain instances can act as a semiconductor in order to aid ice removal. In other embodiments, the ice removal structure may include first and second substantially transparent electrodes sandwiching an anodized layer with columnar structure therebetween.

18 Claims, 4 Drawing Sheets

VEHICLE WINDOW WITH ICE REMOVAL STRUCTURE THEREON

This application relates to a window (e.g., vehicle window) having an ice removal structure provided thereon. In particular, this invention relates to such a window wherein the ice removal structure is at least partially covered with a type of diamond-like carbon (DLC). In other embodiments, an ice removal structure includes first and second electrodes sandwiching therebetween a layer having a plurality of pin holes or apertures defined therein.

BACKGROUND OF THE INVENTION

Ice removal systems are known in the art. For example, see U.S. Pat. No. 6,027,075, the disclosure of which is hereby incorporated herein by reference. See also published U.S. patent application Ser. Nos. 2002/0017466 (published Feb. 14, 2002) and 2001/0052731 (published Dec. 20, 2001), both of which are hereby incorporated herein by reference. Ice removal structures/systems of these patents/applications act so as to modify (e.g., weaken) ice adhesion strength between ice and selected materials in order to facility ice removal. Actions such as scraping ice off of vehicle windshields is made less difficult when the ice adhesion strength is weakened (i.e,. the ice is more easily removed once the adhesion strength has been weakened).

FIGS. 1–2 illustrate a conventional ice removal system as described in the aforesaid '075 Patent. FIG. 1 is a top plan view, while FIG. 2 is a cross sectional view taken along section line A—A. The ice removal system of FIGS. 1–2 acts to reduce the adhesion strength of ice 102 formed on surface 104a of material 104 (e.g. glass). The ice removal system includes a conductive grid 106 formed on the substrate 104, with an insulator 108 therebetween. Power supply (e.g., battery) 109 and voltage regulator subsystem 112 are in electrical communication with conductive grid 106. The ice removal system/structure of FIGS. 1–2 forms a circuit that includes substrate 104 (e.g., glass doped so as to be conductive, or other conductive material), conductive grid 106, and power supply 109. Insulating material 108 causes grid 106 to be electrically insulated from substrate 104.

Still referring to FIGS. 1–2, when no ice is present on the substrate 104, little or no electric current flows between conductive grid 106 and substrate 104. However, when ice 102 forms on surface 104a of substrate 104, the ice is at least partially conductive so as to complete an electrical circuit between conductive grid 106 and substrate 104. In other words, the ice completes an electrical circuit that includes power supply 109, conductive grid 106, ice 102, and substrate 104. In essence, the ice shorts at least one section of the grid to complete this circuit. The resulting current flowing through the aforesaid circuit, upon application of voltage, weakens the ice adhesion strength as explained in U.S. Pat. No. 6,207,075, making it easier for the ice to be removed from the substrate 104 and grid 106 by scraping, wind, melting, and/or the like.

Unfortunately, if used in the context of vehicle windshields, the structure of FIGS. 1–2 (and the '075 Patent) would be undesirable in that it would be very susceptible to damage caused by normal vehicle operation in typical environmental conditions. The ice removal structure of FIGS. 1–2 is rather fragile, and prone to damage such as scratching, peeling off, fracturing, and/or the like.

Accordingly, it will be appreciated by those skilled in the art that there exists a need in the art for a more durable ice removal structure/system for use in applications such as vehicle windows (e.g., windshields and/or backlites), or other exterior windows.

BRIEF SUMMARY OF THE INVENTION

An object of this invention is to provide a window having an ice removal structure formed thereon which is durable and less prone to damage.

Another object of this invention is to provide an efficient ice removal system for use in window applications (e.g., vehicle windows).

Another object of this invention is to provide a window having an ice removal structure formed thereon, wherein the ice removal structure includes at least one layer of diamond-like carbon (DLC) provided over a conductor. The DLC layer(s) protects the ice removal structure and renders it more durable and less susceptible to scratching and the like.

Another object of this invention is to provide a window having an ice removal structure thereon, including a protective layer(s) of DLC. In certain instances, the DLC acts as both a protective layer(s) and as a semiconductor which can aid in the removal of ice (i.e., can aid in reduce adhesion strength of the ice).

Another object of this invention is to deposit the aforesaid DLC using an ion beam(s). In certain embodiments, the ion beam may be directed at the underlying substrate at an angle θ. Angle θ that the ion beam forms with the substrate may be from about 10 to 80 degrees in certain example embodiments of this invention, more preferably from about 30 to 60 degrees, and sometimes from about 40 to 50 degrees.

Another object of this invention is to coat an ice removal structure on a window with at least one layer of a special type of DLC known as highly tetrahedral amorphous carbon (ta-C). The ta-C can function as a semiconductor in certain instances and aid in ice removal in that regard. The ta-C is characterized by a high density (e.g., average density of at least 2.4 gm/cm$^3$) and has a plurality of sp$^3$ carbon-carbon (C—C) bonds. In certain instances, the ta-C has more sp$^3$ carbon-carbon (C—C) bonds than sp$^2$ carbon-carbon (C—C) bonds. In certain instances, at least about 35% of the carbon-carbon bonds in the DLC are of the sp$^3$ type, more preferably at least 50% of the carbon-carbon bonds in the DLC are of the sp$^3$ type even more preferably at least 60% of the carbon-carbon bonds in the DLC are of the sp$^3$ type, and most preferably at least 75% of the carbon-carbon bonds in the DLC are of the sp$^3$ type (the remainder of the carbon-carbon bonds may include at least sp$^2$ carbon-carbon bonds). This special type of DLC enables the layer(s) to function as a protective layer and/or in an electrical fashion as a semiconductor.

Another object of this invention is to fulfill one or more of the aforesaid objects.

In certain example embodiments of this invention, one or more of the above-listed objects and/or needs is/are fulfilled by providing a vehicle windshield comprising: first and second glass substrates laminated via at least a polymer inclusive interlayer, the first substrate supporting a low-E coating that includes at least one layer comprising Ag sandwiched between at least first and second dielectric layers; an ice removal structure including at least one substantially transparent electrode provided on one of the glass substrates, wherein the ice removal structure enables ice adhesion strength to be reduced upon application of voltage; and diamond-like carbon (DLC) at least partially covering the ice removal structure, the DLC having an average density of at least 2.4 gm/cm$^3$ and having more sp$^3$ carbon-carbon (C—C) bonds than sp$^2$ carbon-carbon (C—C) bonds.

In other example embodiments of this invention, one or more of the above-listed objects and/or needs is/are fulfilled by providing a method of making a window including ice removal structure, the method comprising: providing a glass substrate with ice removal structure thereon, the ice removal structure including at least one of conductive rows and columns supported by the glass substrate; and ion beam depositing diamond-like carbon (DLC) over at least part of the ice removal structure, wherein said ion beam depositing comprises directing at least one ion beam toward the ice removal structure at an angle θ so that the DLC is not evenly deposited at a common thickness in all areas, the ion beam angle θ being defined as the angle between the ion beam and a surface of the substrate, and wherein the ion beam angle θ is from about 10 to 80 degrees.

In still further example embodiments of this invention, one or more of the above-listed objects and/or needs is/are fulfilled by providing a vehicle window including ice removal structure, the window comprising: a glass substrate supporting at least a first conductive electrode; an anodized layer; and a second conductive electrode, wherein the anodized layer is between the first and second electrodes; and wherein ice adhesion strength on the window is reduced when voltage is applied between the first and second electrodes. The anodized layer preferably has a plurality of pin holes defined therein which allow water and/or ice to collect/form.

DETAILED DESCRIPTION OF EXAMPLE EMBODIMENTS OF THE INVENTION

Figure 1:
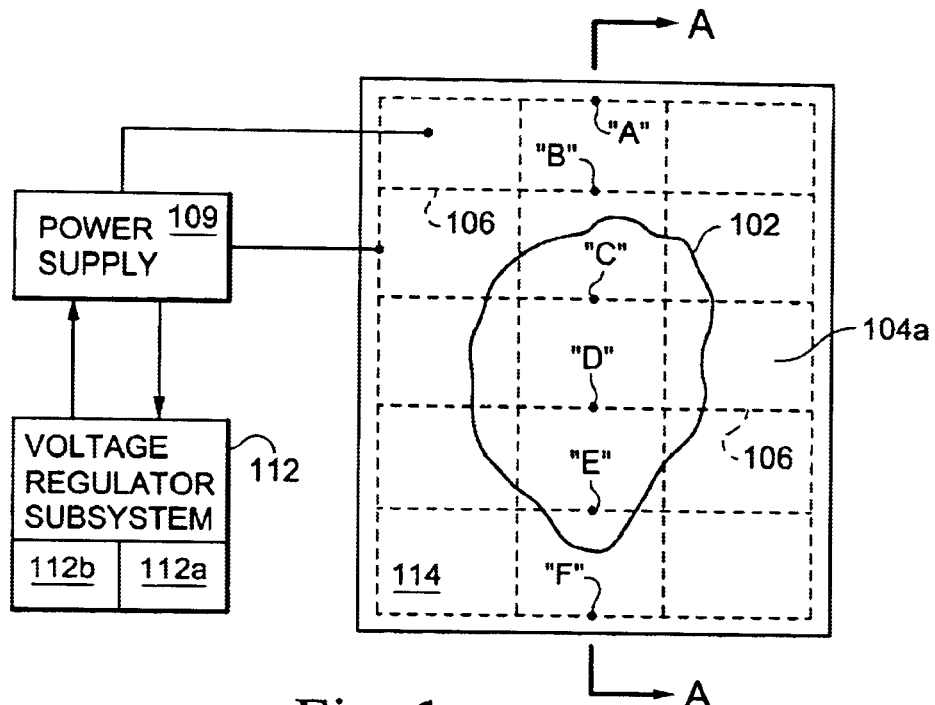
FIG. 1 is a top view of a conventional ice removal system.

Referring now more particularly to the accompanying drawings in which like reference numerals indicate like parts throughout the several views. The instant invention is applicable to ice removal structures and/or systems used in the context of vehicle windows, architectural windows, or any other suitable application.

Figure 2:
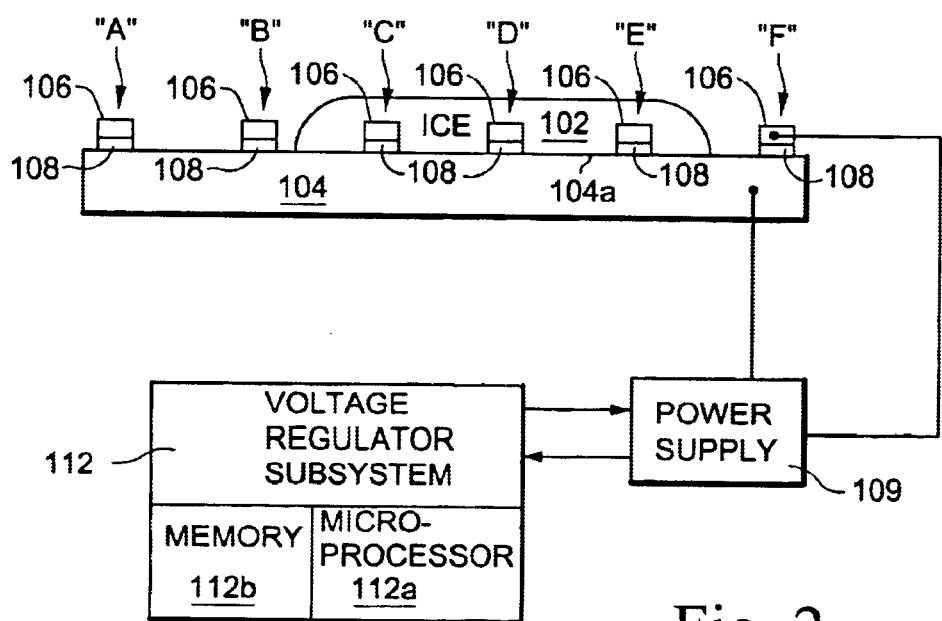
FIG. 2 is a cross sectional schematic diagram of the ice removal system of FIG. 1, taken along section line A—A.
Figure 3:
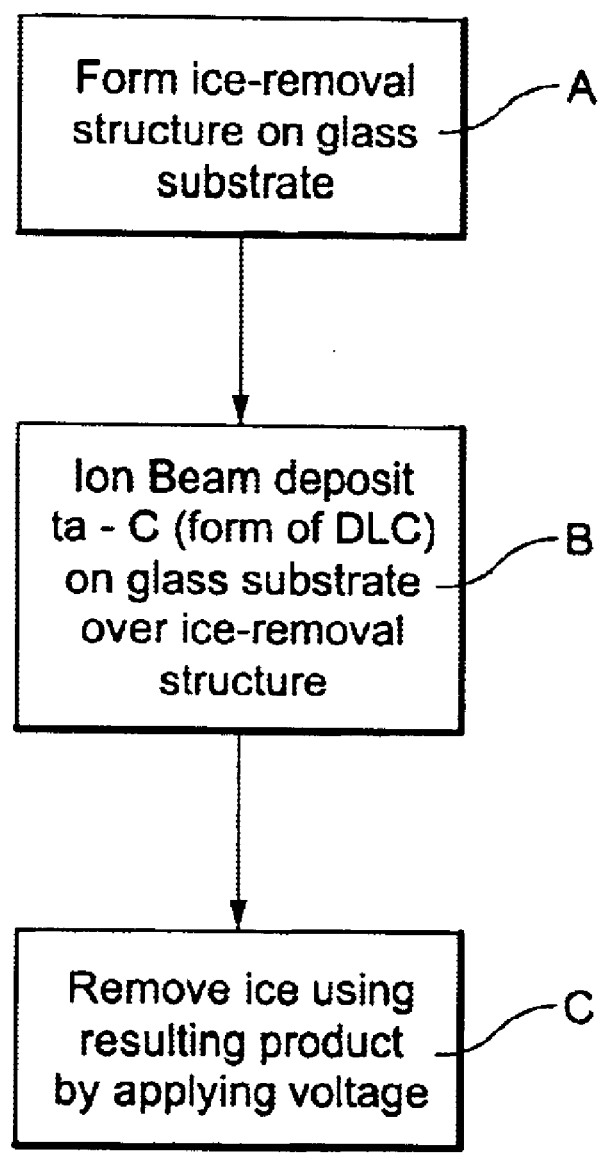
FIG. 3 is a flowchart illustrating certain steps carried out in accordance with an example embodiment of this invention.

FIG. 3 is a flowchart illustrating certain steps carried out in making a window (e.g., vehicle window such as a windshield or backlite) according to an example embodiment of this invention. In step A, ice removal structure is formed on a glass substrate. An example ice removal structure in this regard is shown in FIGS. 1–2, although this invention is not so limited as any other suitable type of ice removal structure will suffice. Thereafter, in step B, at least one layer of diamond-like carbon (DLC) is ion beam deposited on the glass substrate in order to at least partially cover the ice removal structure formed in step A. In certain embodiments of this invention, the ta-C type of DLC may be included in the DLC layer(s). Once the window is formed, application of voltage to the ice removal structure causes the adhesion strength of ice on the window to weaken so that it can be more easily removed as shown in step C.

Figure 4:
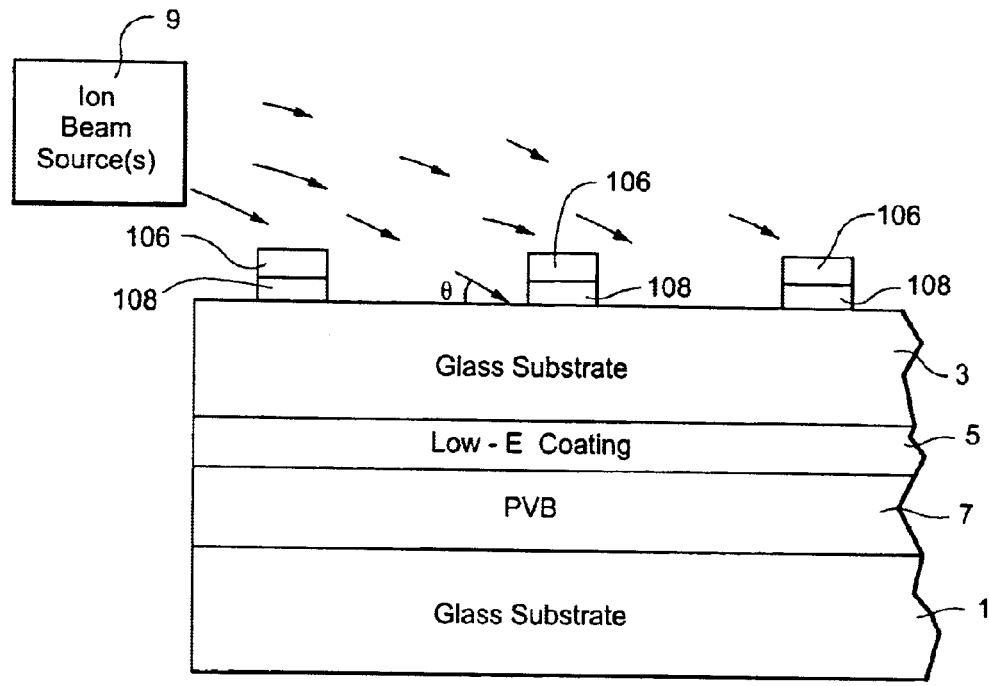
FIG. 4 is a cross sectional view of a window according to an example embodiment of this invention, during a process of DLC ion beam deposition.
Figure 5:
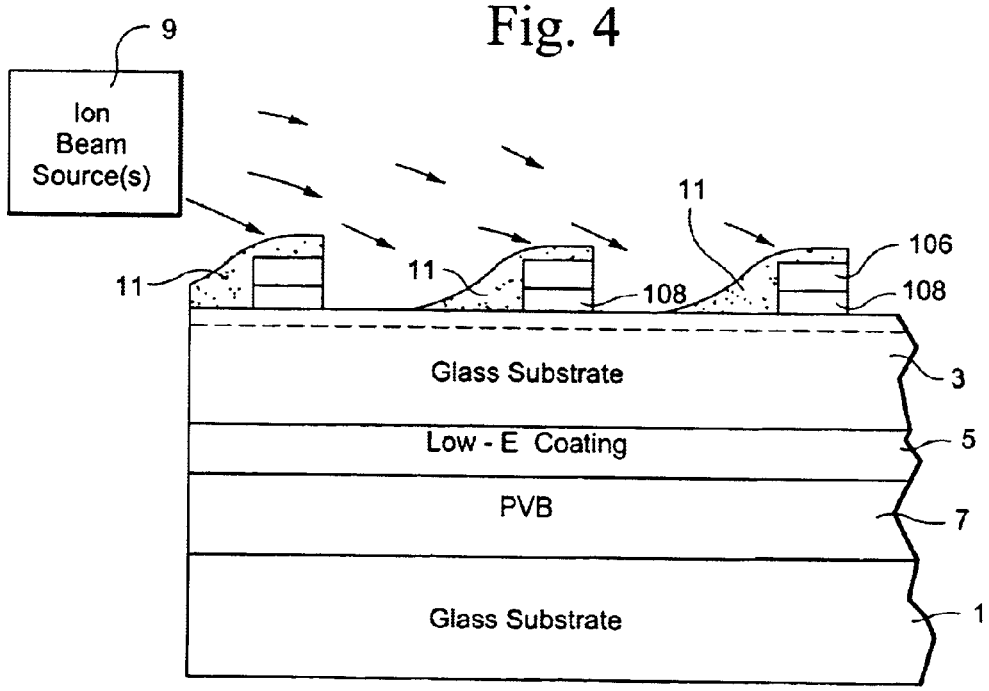
FIG. 5 is a cross sectional view of a window of FIG. 4, after some or all of the DLC has been ion beam deposited on the window over ice removal structure.
Figure 6:
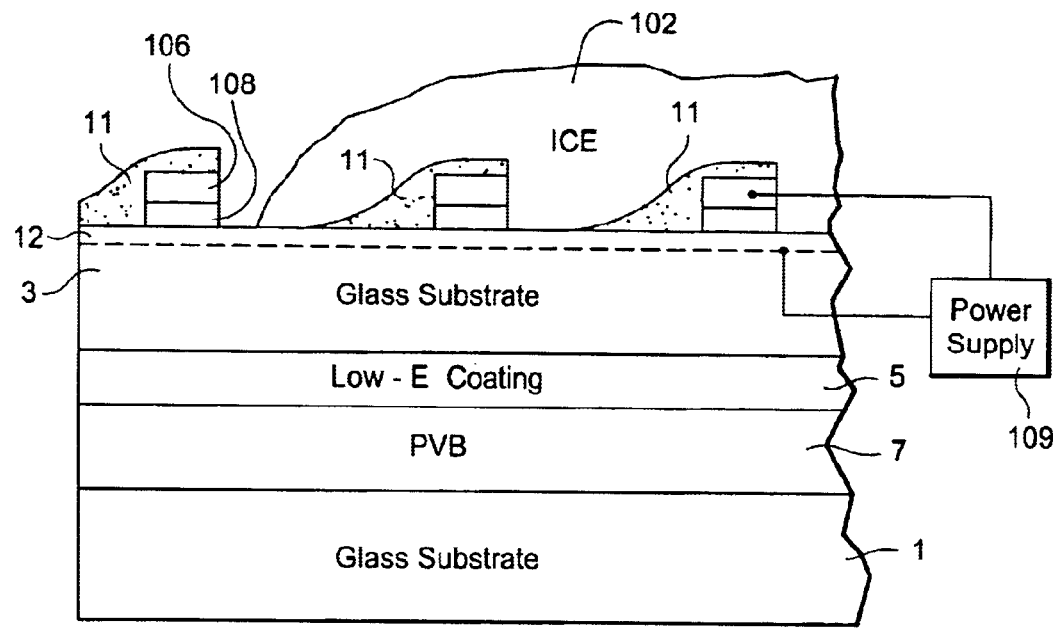
FIG. 6 is a cross sectional view of the window of FIGS. 5–6, with ice thereon.

FIGS. 4–6 illustrate how an example vehicle windshield may be made according to certain example non-limiting embodiments of this invention. First and second glass substrates 1 and 3 are heat bent and laminated together via polymer inclusive interlayer 7. Each of the glass substrates may be of soda-lime-silica glass, or any other suitable type of glass which may be used in the context of vehicle windows. The polymer inclusive interlayer 7 may be of or include polyvinyl butyral (PVB), or any other suitable polymer that may be used in order to laminate the two glass substrates to one another. Optionally, one or both of the glass substrates is coated with a low-E (low emissivity) coating 5 which functions to block at least some IR and/or UV radiation and prevent it from entering the vehicle interior. Example low-E coatings are disclosed, for example and without limitation, in U.S. Pat. Nos. 5,557,462, 5,425,861, 5,770,321, 6,014,872, 6,059,909, all hereby incorporated herein by reference. Other example low-E coatings are disclosed in U.S. Ser. No. 09/794,224, filed Feb. 28, 2001 (counterpart to WO 02/04375), also incorporated herein by reference. Generally, low-E coatings herein include at least one IR reflecting layer (e.g., Ag) provided between at least first and second dielectric layers (e.g., silicon nitride, silicon oxide, silicon oxynitride, zinc oxide, tin oxide, and/or the like). In some instances, low-E coatings may include two or more such Ag layers.

The ice removal structure including conductor(s) 106 and insulator 108 may be formed on substrate 3 either before of after the substrate 3 is laminated to substrate 1. Details of conductor 106 and insulator 108 are discussed in U.S. Pat. No. 6,027,075, incorporated herein by reference. See also published U.S. patent application Ser. Nos. 2002/0017466 and 2001/0052731, both incorporated herein by reference. In certain embodiments of this invention, conductor 106 and insulator 108 are substantially transparent to visible light so as to not significantly interfere with a driver's ability to see through the windshield when driving. Conductor 106 may be of or include any suitable substantially transparent thin film conductor, including metal oxides, metals, metal alloy oxides (e.g., $AlZnO_x$—aluminum zinc oxide). Insulator 108 is preferably of a dielectric material.

At least one ion beam source 9 is provided in order to deposit the DLC inclusive coating 11 on substrate 3 so as to at least partially cover the ice removal structure 106, 108. DLC inclusive coating 11 may be a single layer or may include multiple layers in different embodiments of this invention. When coating 11 includes diamond-like carbon (DLC), the coating 11 may be of or include any of the coatings of any of U.S. Pat. Nos. 6,338,901, 6,261,693, 6,284,377, 6,303,225, 5,846,649, 5,637,353 (all incorporated herein by reference), or any other suitable DLC inclusive coating that may be ion beam deposited onto the substrate. Example thicknesses for single or multi-layer coating 11 are discussed in the aforesaid patents. The DLC in certain embodiments may be hydrogentated (e.g., ta-C:H) (e.g., from about 2 to 40% H, more preferably from about 5 to 30% H, and most preferably from about 10 to 20% H) or otherwise doped, and may have an average hardness of at least 10 GPa, more preferably of at least 20 GPa. The DLC may be hydrophobic (high contact angle), hydrophilic (low contact angle), or neither in different embodiments of this invention.

The DLC inclusive coating 11 may include at least one layer of a special type of DLC known as highly tetrahedral amorphous carbon (ta-C). The ta-C can function as a semiconductor in certain instances and can thus aid in ice removal in that regard. The ta-C (and thus layer(s) 11 in certain instances) is characterized by a high density (e.g., density of at least 2.4 gm/cm$^3$, more preferably a density of at least 2.7 gm/cm$^3$) and has a plurality of sp$^3$ carbon-carbon (C—C) bonds. In certain embodiments of this invention, the ta-C (and thus layer(s) 11 in certain instances) has more sp$^3$ carbon-carbon bonds than sp$^2$ carbon-carbon bonds. In certain embodiments of this invention, at least about 35% of the carbon-carbon bonds in the DLC are of the sp$^3$ type, more preferably at least about 50% of the carbon-carbon bonds in the DLC are of the sp$^3$ type, even more preferably at least about 60% of the carbon-carbon bonds in the DLC are of the sp$^3$ type, and most preferably at least 75% of the carbon-carbon bonds in the DLC are of the sp$^3$ type (the remainder of the carbon-carbon bonds may include at least sp$^2$ carbon-carbon bonds). This special type of DLC enables the layer(s) to function as a protective layer and/or in an electrical fashion as a semiconductor. If acting as a semiconductor, the DLC can help aid in the removal of ice from the windshield. The DLC of layer(s) 11 may be p-doped in certain embodiments of this invention, or may be n-doped in other embodiments of this invention (example semiconductor dopants in this regard include B and P). In certain example embodiments, the DLC of layer(s) 11 may be doped with N and/or P in order to make the DLC more conductive.

Example ion beam sources that may be used to ion beam deposit layer(s) 11 are discussed in U.S. Pat. Nos. 6,303,225, 6,284,377, and 6,303,226, all incorporated herein by reference. Gas such as acetylene may be used in the source in order to deposit the DLC inclusive layer 11. As shown in FIG. 4, the ion beam from source(s) 9 is directed at the substrate at an angle θ. The angle θ (defined as the angle between a direction of the ion beam and the surface of the substrate 3) may be from about 10 to 80 degrees in certain example embodiments of this invention, more preferably from about 30 to 60 degrees, and sometimes from about 40 to 50 degrees. By directing the ion beam at the substrate 11 with the ice removal structure 106, 108 thereon at an ion beam angle θ, it is possible to use the ice removal structure 106, 108 itself as a blocking element(s) in order to prevent (or reduce) the DLC 11 from completely filling in the gaps between adjacent conductors 106. When the DLC 11 does not completely fill in the gaps between adjacent conductors 106 (see FIG. 5), this allows ice 102 to form near a bottom of the gaps in order to complete the electrical circuit as discussed above (see FIG. 6). While the ion beam is directed at the substrate at an angle θ in certain embodiments of this invention, this invention is not so limited in all embodiments.

FIG. 6 illustrates the formation of ice 102 on the windshield made in FIGS. 4–5. It can be seen that the ice 102 fills in the gaps between adjacent conductors 106. The DLC 11 may or may not help fill in these gaps in certain instances. Ice is a protonic semiconductor. Thus, the presence of ice 102 in the gaps between adjacent conductors 106 as shown in FIG. 6 enables an electrical circuit to be completed. Upon application of voltage (e.g., using power source 109 such as the vehicle battery), the resulting current flowing through the aforesaid circuit including ice 102 and conductor(s) 106 weakens the ice adhesion strength thereby making it easier for the ice to be removed from the window by scraping, wind, melting, and/or the like.

In certain embodiments of this invention, the top surface portion of the glass substrate 3 may be doped with a substantially transparent conductor such as indium-tin-oxide (ITO) or fluoride doped silicon oxide in order to make the top surface of the glass substrate 3 a substantially transparent semiconductor. In such embodiments, the aforesaid circuit through which current from source 109 flows includes conductor(s) 106, ice 102 and substrate 3. For example, current from the source 109 may flow from conductor(s) 106 through ice 102 to substrate 3 (the ice completes the circuit) in order to reduce the ice's adhesion strength. However, in other embodiments of this invention, the top surface of substrate 3 may be coated with a substantially transparent conductive layer (see dotted line in FIG. 6, and reference numeral 12). In such embodiments, the circuit through which current from source 109 flows includes conductor(s) 106, ice 102 and conductor 12. For example, current from the source 109 may flow from conductor(s) 106 through ice 102 to layer 12 (the ice completes the circuit) in order to reduce the ice's adhesion strength.

In embodiments where the DLC 11 acts as a semiconductor and helps in ice removal, the DLC may be provided only on top surfaces of conductor(s) 106 (e.g., so as to not complete a circuit between conductors 106 and substrate 3 of layer 12). Those skilled in the art will also recognize that the DLC 11 may be deposited as shown in FIG. 6 even if it does act as a semiconductor in certain embodiments of this invention. When the ice receives more current flow than the DLC, the ice adhesion strength is significantly reduced. Ice will be more conductive than the DLC.

Figure 7:
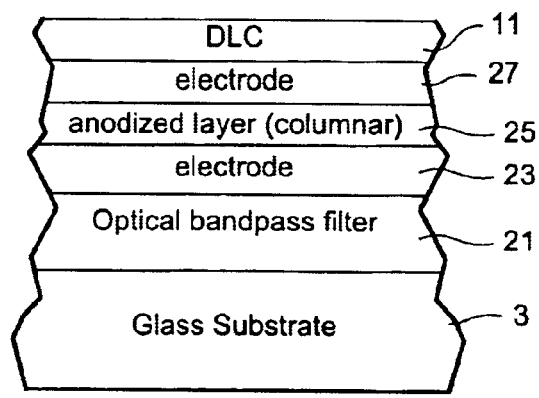
FIG. 7 is a cross sectional view of another embodiment of this invention.

FIG. 7 is a cross sectional view of another embodiment of this invention. This embodiment may be used in the context of vehicle windows (see FIGS. 4–6 above), or in any other suitable context. As shown in FIG. 7, the glass substrate 3 supports an optional optical bandpass filter (single or multi-layer) 21, bottom electrode 23, anodized layer 25 with apertures defined therein, top electrode 27 and optional DLC inclusive layer 11. Each of layers 23, 25, 27 and 11 is substantially transparent (e.g., at least 80% transparent, more preferably at least 90% transparent, and sometimes at least 95% transparent) to visible light in certain embodiments of this invention. Optional bandpass filter 21 may be used to optimize the overall transmission of light through the window (e.g., windshield). Windshields herein preferably have a visible transmission of at least 70%, more preferably of at least 75%.

Substantially transparent electrodes 23 and 27 are of conductive thin films. Electrodes may be of or include metal oxide or metal alloy oxide including but not limited to aluminum zinc oxide (e.g., deposited by sputtering or electron beam evaporation) in certain embodiments of this invention. In one non-limiting example, layer 23 may have a sheet resistance of about 50–100 ohms/square and a thickness of about 125 nm (quarter wave). After its deposition, electrode layer 23 is coated with a layer 25 (e.g., Al metal) which can also be sputtered at an example non-limiting thickness of from about 10–20 nm. Layer 25 can be electrochemically anodized using a process where 10% orthophosphoric acid is used at a voltage of about 150–200 V in order to form apertures (e.g., pin holes or apertures of any other suitable size) in the layer. The anodized layer 25, including a columnar structure (i.e., having pin holes therein due to the anodization), is then overcoated with a thin top electrode layer 27 (see example materials above for layer 23) (e.g., from about 200 to 600 angstroms thick, more preferably from about 300 to 500 angstroms thick, most preferably about 400 angstroms thick).

As a result of the anodization, the anodized layer 25 has pin holes or otherwise sized apertures defined therein. The apertures (e.g., pin holes) in anodized layer 25 may or may not extend all the way through the layer 25 to electrode 23 in different embodiments of this invention. The top electrode 27 is not continuous, as when it is deposited it overlies the solid portion of anodized layer 25 and does not cover or fill in all the apertures in anodized layer 25. Water can seep into the pin holes in the anodized layer, and form ice. When voltage is applied (AC or DC) between electrodes 23 and 27, the water and/or ice in the holes of anodized layer 25 completes a circuit. This causes the ice adhesion strength to be reduced, starting in the holes and proceeding outwardly to the interface of the ice with the ice removal structure top electrode.

By applying or sustaining a DC voltage (e.g., 10–20 volts) or low frequency AC (30–60 Hz or 15–20 kHz in some cases) between the top and bottom electrodes 23, 27, the ice adhesion strength can be reduced as described above. In certain instances, gas bubbles are produced at the ice/metal interface. Even though the gas bubbles cover a small fraction of the interface, they act to significantly reduce the interfacial strength of the ice to the metal oxide of the top electrode. As in earlier embodiments of this invention, it is possible in certain instances to provide a protective layer 11 including DLC over the structure as shown in FIG. 7. When DLC inclusive layer 11 is ion beam deposited, it need not fill in all the pin holes in layers 25, 27 in view of the ion beam deposition technique used to form the DLC. This protective layer 11, instead of DLC, may include nickel chrome oxide or any other suitable protective material.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A vehicle windshield comprising:
   first and second glass substrates laminated via at least a polymer inclusive interlayer, the first substrate supporting on an interior surface thereof a low-E coating that includes at least one layer comprising Ag sandwiched between at least first and second dielectric layers;
   an ice removal structure provided on one of the glass substrates, wherein the ice removal structure comprises a circuit that includes as components through which electrical current flows (a) one of the glass substrates, and (b) a conductive layer spaced from the one glass substrate via an insulator; and
   diamond-like carbon (DLC) at least partially covering the ice removal structure in a non-uniform manner, the DLC having an average density of at least 2.4 gm/cm$^3$ and having more sp$^3$ carbon-carbon (C—C) bonds than sp$^2$ carbon-carbon (C—C) bonds.

2. The vehicle windshield of claim 1, wherein at least about 50% of the carbon-carbon bonds in the DLC are of the sp$^3$ type.

3. The vehicle windshield of claim 1, wherein at least about 60% of the carbon-carbon bonds in the DLC are of the sp$^3$ type.

4. The vehicle windshield of claim 1, wherein at least about 75% of the carbon-carbon bonds in the DLC are of the sp$^3$ type.

5. The vehicle windshield of claim 1, wherein the conductive layer of the ice removal structure comprises a conductive grid, and the DLC is provided so as to at least partially cover the conductive grid.

6. The vehicle windshield of claim 5, wherein a dielectric is provided between the conductive grid and the one substrate.

7. The vehicle windshield of claim 1, wherein the DLC is doped with at least one of N and P in order to make the DLC more conductive.

8. The vehicle windshield of claim 1, wherein the circuit of the ice removal structure further includes: (c) at least part of the DLC through which current flows between the glass substrate and the conductive layer.

9. A vehicle windshield comprising:
   first and second glass substrates laminated via at least a polymer inclusive interlayer,
   an ice removal structure provided on one of the glass substrates; and
   diamond-like carbon (DLC) at least partially covering the ice removal structure in a non-uniform manner.

10. The vehicle windshield of claim 9, wherein the DLC has an average density of at least 2.4 gm/cm$^3$ and having more sp$^3$ carbon-carbon (C—C) bonds than sp$^2$ carbon-carbon (C—C) bonds.

11. The vehicle windshield of claim 9, wherein the ice removal structure comprises a circuit that includes as components through which electrical current flows (a) one of the glass substrates, (b) a conductive layer spaced from the one glass substrate via an insulator, and (c) the DLC.

12. The vehicle windshield of claim 9, wherein the DLC is doped with at least one dopant in order to make the DLC more conductive.

13. The vehicle windshield of claim 9, wherein the DLC is hydrogenated.

14. The vehicle windshield of claim 9, wherein at least about 50% of the carbon-carbon bonds in the DLC are of the sp$^3$ type.

15. The vehicle windshield of claim 9, wherein at least about 60% of the carbon-carbon bonds in the DLC are of the sp$^3$ type.

16. The vehicle windshield of claim 9, wherein at least about 75% of the carbon-carbon bonds in the DLC are of the sp$^3$ type.

17. The vehicle windshield of claim 9, wherein the ice removal structure comprises a conductive layer which forms at least part of a conductive grid, and the DLC is provided so as to at least partially cover the conductive grid.

18. The vehicle windshield of claim 9, wherein the DLC is deposited in a thicker manner on or adjacent one sidewall of a conductive member of the ice removal structure that on another sidewall of the conductive member, the another sidewall being located opposite the one sidewall.

* * * * *